(12) United States Patent
Wang et al.

(10) Patent No.: US 11,539,206 B2
(45) Date of Patent: Dec. 27, 2022

(54) INPUT OUTPUT CIRCUIT AND ELECTROSTATIC DISCHARGE PROTECTION CIRCUIT

(71) Applicant: MACRONIX International Co., Ltd., Hsinchu (TW)

(72) Inventors: Shih-Yu Wang, Taipei (TW); Wen-Tsung Huang, Changhua County (TW); Chih-Wei Hsu, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 47 days.

(21) Appl. No.: 17/164,239

(22) Filed: Feb. 1, 2021

(65) Prior Publication Data

US 2022/0247171 A1  Aug. 4, 2022

(51) Int. Cl.
*H02H 9/04* (2006.01)
*H03K 17/082* (2006.01)

(52) U.S. Cl.
CPC ......... *H02H 9/046* (2013.01); *H03K 17/0826* (2013.01)

(58) Field of Classification Search
CPC ............................ H02H 9/046; H03K 17/0826
USPC .......................................................... 361/56
See application file for complete search history.

(56) References Cited

U.S. PATENT DOCUMENTS

2012/0300349 A1* 11/2012 Abou-Khalil ....... H01L 27/0285
　　　　　　　　　　　　　　　　　　　　716/102
2013/0321961 A1* 12/2013 Lin ........................ H02H 9/046
　　　　　　　　　　　　　　　　　　　　29/825

FOREIGN PATENT DOCUMENTS

| TW | 200514232 | 4/2005 |
| TW | 200601544 | 1/2006 |
| TW | 200917453 | 4/2009 |
| TW | 201230581 | 7/2012 |

OTHER PUBLICATIONS

TW 200917453; ESD protection circuit for IC with separated power domains; Specification and Figures; Apr. 6, 2009 (Year: 2009).*

* cited by examiner

*Primary Examiner* — Dharti H Patel
(74) *Attorney, Agent, or Firm* — J.C. Patents

(57) ABSTRACT

An input output circuit and an electrostatic discharge (ESD) protection circuit are provided. The ESD protection circuit is adapted to a charged-device model (CDM). The ESD protection circuit includes a bipolar junction transistor (BJT). The BJT has a first end coupled to an input end of an input buffer and an output end of an output buffer. A second end of the BJT is coupled to a first ground rail. A control end of the BJT is coupled to one of a first power rail, a second power rail, the first ground rail and a second ground rail.

18 Claims, 4 Drawing Sheets

INPUT OUTPUT CIRCUIT AND ELECTROSTATIC DISCHARGE PROTECTION CIRCUIT

BACKGROUND

Technical Field

The disclosure relates to an input output circuit and an electrostatic discharge protection circuit, and particularly relates to an input output circuit and an electrostatic discharge protection circuit that reduce voltage stress during an electrostatic discharge test.

Description of Related Art

Conventionally, when an electrostatic discharge protection operation for a charged-device model is performed on an input output circuit, a metal oxide semiconductor field-effect transistor with a grounded gate is often used to provide a drain path for an electrostatic discharge current. However, during an electrostatic discharge test, especially in a negative voltage mode, excessive voltage stress is likely to occur at the drain and source of the metal oxide semiconductor field-effect transistor with the grounded gate, thus causing damage to the metal oxide semiconductor field-effect transistor with the grounded gate. As a result, an internal circuit of an integrated circuit cannot be well protected and the reliability of the circuit is reduced.

SUMMARY

The disclosure provides an electrostatic discharge protection circuit in which a transistor performing a current draining operation can be protected from damage due to excessive voltage.

An electrostatic discharge protection circuit of the disclosure is adapted to a charged-device model. The electrostatic discharge protection circuit includes a bipolar junction transistor. The bipolar junction transistor has a first end coupled to an input end of an input buffer and an output end of an output buffer. A second end of the bipolar junction transistor is coupled to a first ground rail. A control end of the bipolar junction transistor is coupled to one of a first power rail, a second power rail, the first ground rail and a second ground rail. The input buffer receives first operating power and a first ground voltage respectively through the first power rail and the first ground rail. The output buffer receives second operating power and a second ground voltage respectively through the second power rail and the second ground rail.

An input output circuit of the disclosure includes an input buffer, an output buffer, and the electrostatic discharge protection circuit as described above.

Based on the above, in the disclosure, the bipolar junction transistor is connected between the output buffer and the input buffer. According to the type (PNP or NPN) of the bipolar junction transistor, the control end (base) of the bipolar junction transistor is coupled to the first power rail, the second power rail, the first ground rail or the second ground rail. By using the characteristics of the bipolar junction transistor, in an electrostatic discharge state of the charged-device model, a voltage difference between the first end and the second end (i.e., between the collector and the emitter) of the bipolar junction transistor can be reduced, such that voltage stress applied on the bipolar junction transistor is reduced and the risk of damage to the bipolar junction transistor is eliminated.

DESCRIPTION OF THE EMBODIMENTS

Figure 1:
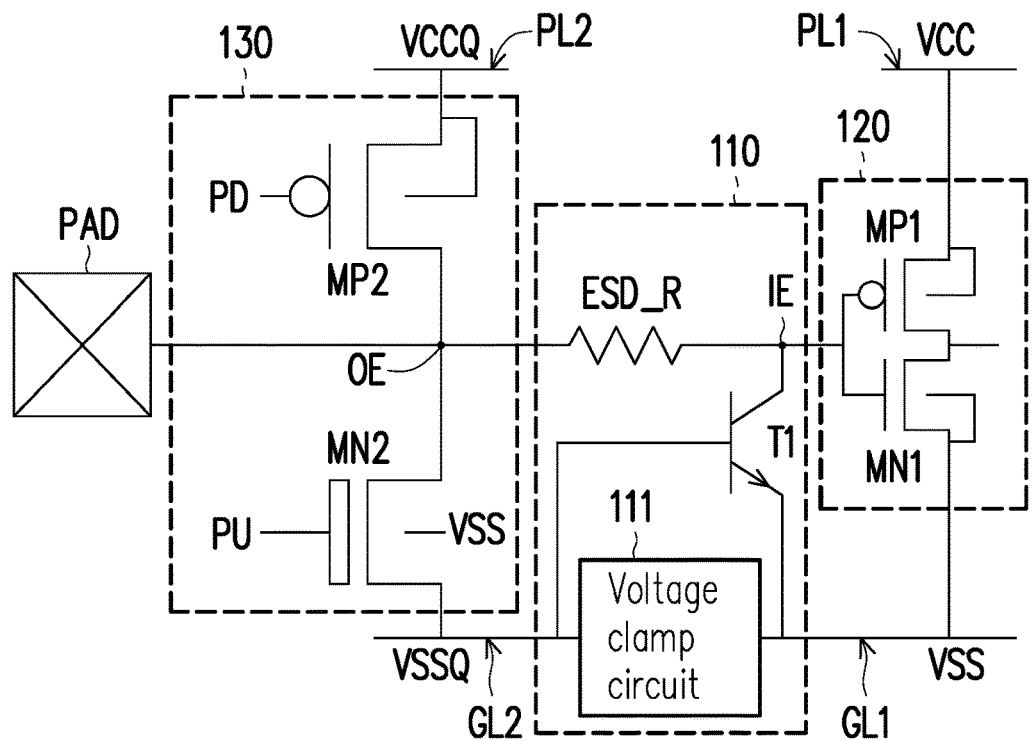
FIG. 1 illustrates a schematic diagram of an input output circuit according to an embodiment of the disclosure.

Referring to FIG. 1, FIG. 1 illustrates a schematic diagram of an input output circuit according to an embodiment of the disclosure. An input output circuit 100 includes an electrostatic discharge protection circuit 110, an input buffer 120, and an output buffer 130. In the present embodiment, the input buffer 120 is coupled to a first power rail PL1 and a first ground rail GL1, and receives operating power VCC and a ground voltage VSS respectively through the first power rail PL1 and the first ground rail GL1. The output buffer 130 is coupled to a second power rail PL2 and a second ground rail GL2, and receives operating power VCCQ and a ground voltage VSSQ respectively through the second power rail PL2 and the second ground rail GL2. In present embodiment, when an electrostatic discharge (ESD) event is occurred, the input buffer 120 may be configured to be a part of the electrostatic discharge protection circuit.

The input buffer 120 includes transistors MP1 and MN1. A first end of the transistor MP1 is coupled to the first power rail PL1; a second end of the transistor MP1 is coupled to a first end of the transistor MN1; a control end of the transistor MP1 forms an input end IE of the input buffer 120 and is coupled to a control end of the transistor MN1. A second end of the transistor MN1 is coupled to the first ground rail GL1. The output buffer 130 includes transistors MP2 and MN2. A first end of the transistor MP2 is coupled to the second power rail PL2; a second end of the transistor MP2 is coupled to the first end of the transistor MN1 and forms an output end OE of the output buffer 130, in which the output end OE of the output buffer 130 is connected to a pad PAD; a control end of the transistor MP2 receives a control signal PU. A control end of the transistor MN2 receives a control signal PD, and a second end of the transistor MN2 is coupled to the second ground rail GL2.

The electrostatic discharge protection circuit 110 includes a bipolar junction transistor (BJT) T1. In the present embodiment, a first end (collector) of the bipolar junction transistor T1 is coupled to the input end IE of the input buffer 120, a second end (emitter) of the bipolar junction transistor T1 is coupled to the first ground rail GL1, and a control end (base) of the bipolar junction transistor T1 is coupled to the second ground rail GL2. It is noted that the bipolar junction transistor T1 in the present embodiment is an NPN transistor.

The electrostatic discharge protection circuit 110 further includes a resistor ESD_R and a voltage clamp circuit 111. The resistor ESD_R is coupled between the input end IE of the input buffer 120 and the output end OE of the output buffer 130. In addition, the voltage clamp circuit 111 is coupled between the first ground rail GL1 and the second ground rail GL2.

When an electrostatic discharge test for a charged-device model is performed on the input output circuit 100, the bipolar junction transistor T1 may be turned on and used to clamp a voltage on the input end IE of the input buffer 120, so as to protect the input buffer 120 from damage. Besides, in present embodiment, a current direction in a positive voltage test mode of human body model (HBM) is same to a current direction in a negative voltage test mode of charged-device model (CDM), and a current direction in a negative voltage test mode of HBM is same to a current direction in a positive voltage test mode of CDM. Such as that, in present embodiment, the test modes of the positive voltage and the negative voltage for CDM, can also be respectively applied to the test modes of the negative voltage and the positive voltage for HBM.

In detail, in a negative voltage test mode, the transistor MN2 may be turned on, and a current drain path may be formed from the pad PAD, through the transistor MN2, the second ground rail GL2, the voltage clamp circuit 111 to the first ground rail GL1. In addition, the bipolar junction transistor T1 is also turned on, and another current drain path may be formed from the pad PAD, through the resistor ESD_R, the bipolar junction transistor T1 to the first ground rail GL1. It is worth noting that, since an electrostatic discharge current may flow from the second ground rail GL2 to the first ground rail GL1 through the voltage clamp circuit 111, the ground voltage VSSQ on the second ground rail GL2 may be greater than the ground voltage VSS on the first ground rail GL1. At this time, a p-n junction between the control end (base) and the second end (emitter) of the bipolar junction transistor T1 may limit a voltage difference between the ground voltage VSSQ and the ground voltage VSS from being too large, thereby effectively reducing voltage stress applied between the first end and the second end of the bipolar junction transistor T1, and reducing the possibility of damage to the bipolar junction transistor T1.

On the other hand, in a positive voltage test mode, the transistor MN2 may be turned on, and a current drain path may be formed from the first ground rail GL1, through the voltage clamp circuit 111, the second ground rail GL2, the transistor MN2 to the pad PAD. In addition, the bipolar junction transistor T1 is also turned on, and another current discharge path may be formed from the first ground rail GL1, through the bipolar junction transistor T1, the resistor ESD_R to the pad PAD, so as to achieve the electrostatic discharge protection effect.

In addition, in the present embodiment, the transistors MP1 and MP2 are P-type metal oxide semiconductor field-effect transistors, and the transistors MN1 and MN2 are N-type metal oxide semiconductor field-effect transistors. In addition, a bulk of the transistor MN2 in the output buffer 130 is coupled to the first ground rail GL1 to receive the ground voltage VSS.

On the other hand, in the present embodiment, the control end of the bipolar junction transistor T1 is not necessarily coupled to the second ground rail GL2 and may be coupled to the first ground rail GL1.

Figure 2:
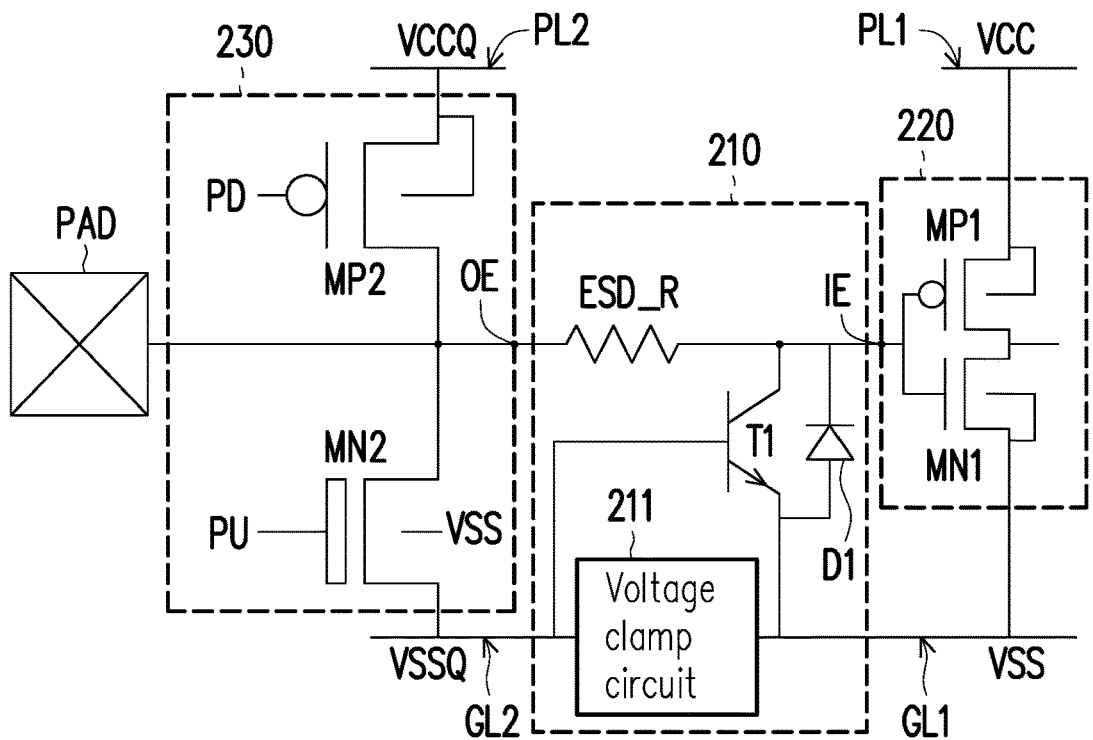
FIG. 2 illustrates a schematic diagram of an input output circuit according to another embodiment of the disclosure.

Referring to FIG. 2, FIG. 2 illustrates a schematic diagram of an input output circuit according to another embodiment of the disclosure. An input output circuit 200 includes an electrostatic discharge protection circuit 210, an input buffer 220, and an output buffer 230. In the present embodiment, the input buffer 220 is coupled to the first power rail PL1 and the first ground rail GL1, and receives the operating power VCC and the ground voltage VSS respectively through the first power rail PL1 and the first ground rail GL1. The output buffer 130 is coupled to the second power rail PL2 and the second ground rail GL2, and receives the operating power VCCQ and the ground voltage VSSQ respectively through the second power rail PL2 and the second ground rail GL2. The input buffer 220 is composed of the transistors MP1 and MN1, and the output buffer 230 is composed of the transistors MP2 and MN2.

The electrostatic discharge protection circuit 210 includes the bipolar junction transistor T1, the resistor ESD_R and a voltage clamp circuit 211. The coupling relationship of the circuit is similar to that in the embodiment of FIG. 1, and will not be described in detail herein.

A difference from the embodiment of FIG. 1 is that, in the embodiment of the disclosure, a diode D1 may be formed between the first end and the second end of the bipolar junction transistor T1. An anode of the diode D1 is coupled to the first ground rail GL1, and a cathode of the diode D1 may be coupled to the input end IE of the input buffer 220. The diode D1 may be used to enhance reverse current drain ability and improve the electrostatic discharge protection ability in the positive voltage test mode during the electrostatic discharge test for the charged-device model.

Figure 3:
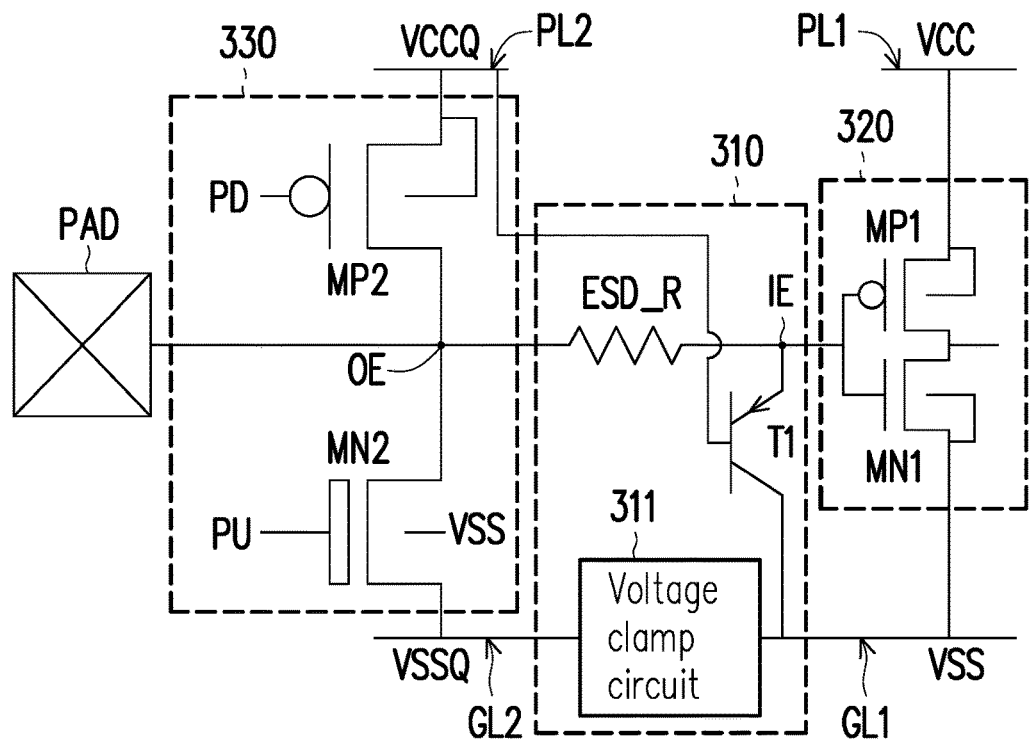
FIG. 3 illustrates a schematic diagram of an input output circuit according to another embodiment of the disclosure.

Referring to FIG. 3, FIG. 3 illustrates a schematic diagram of an input output circuit according to another embodiment of the disclosure. An input output circuit 300 includes an electrostatic discharge protection circuit 310, an input buffer 320, and an output buffer 330. The input buffer 320 and the output buffer 330 are implemented in the same manner as the input buffers 120 and 220 and the output buffers 130 and 230 in the embodiments of FIG. 1 and FIG. 2, and will not be described in detail herein.

The electrostatic discharge protection circuit 310 includes the resistor ESD_R, the bipolar junction transistor T1 and a voltage clamp circuit 311. A difference from the embodiments of FIG. 1 and FIG. 2 is that the bipolar junction transistor T1 of the present embodiment is a PNP transistor. The first end (emitter) of the bipolar junction transistor T1 is coupled to the input end IE of the input buffer 320, the second end (collector) of the bipolar junction transistor T1 is coupled to the first ground rail GL1, and the control end (base) of the bipolar junction transistor T1 is coupled to the second power rail PL2.

During the electrostatic discharge test, a voltage on the second power rail PL2 may be near to the ground voltage VSSQ. Therefore, in the negative voltage test mode for the charged-device model, the bipolar junction transistor T1 may be turned on in response to a voltage on the pad PAD becoming higher than the ground voltage VSSQ, and a current drain path for electrostatic discharge is generated.

Similarly, in the positive voltage test mode for the charged-device model, the bipolar junction transistor T1 may also be turned on and another current drain path for electrostatic discharge may be generated.

Figure 4:
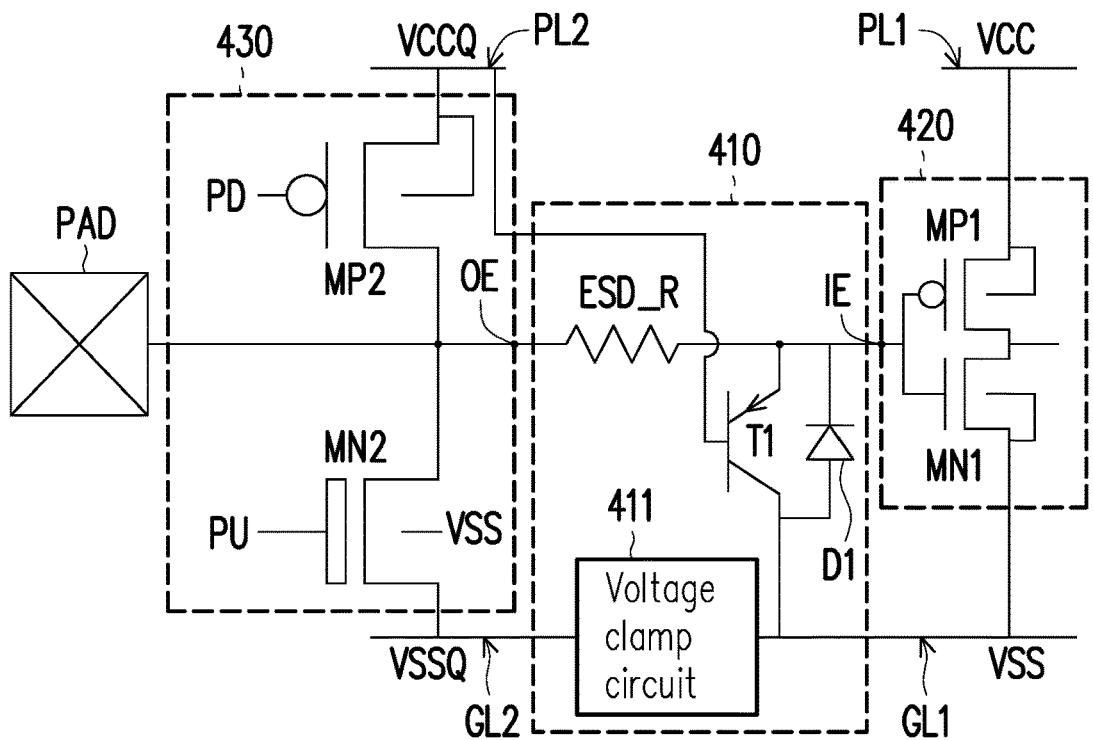
FIG. 4 illustrates a schematic diagram of an input output circuit according to another embodiment of the disclosure.

Referring next to FIG. 4, FIG. 4 illustrates a schematic diagram of an input output circuit according to another embodiment of the disclosure. An input output circuit 400 includes an electrostatic discharge protection circuit 410, an input buffer 420, and an output buffer 430. The input buffer 420 and the output buffer 430 are implemented in the same manner as the input buffer 320 and the output buffer 330 in the embodiment of FIG. 3, and will not be described in detail herein. A difference from the embodiment of FIG. 3 is that, in the embodiment of the disclosure, the diode D1 may be provided at both ends of the bipolar junction transistor T1. The anode of the diode D1 is coupled to the first ground rail GL1, and the cathode of the diode D1 may be coupled to the input end IE of the input buffer 420. The diode D1 may be used to enhance the reverse current drain ability and improve the electrostatic discharge protection ability in the positive voltage test mode during the electrostatic discharge test for the charged-device model.

Figure 5:
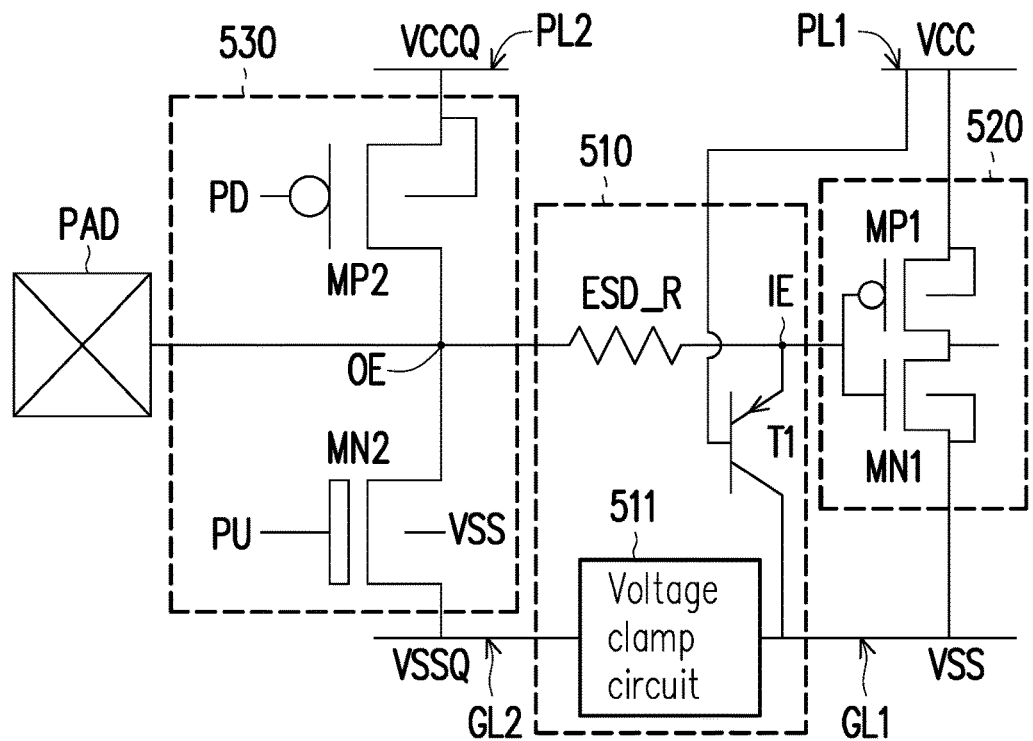
FIG. 5 illustrates a schematic diagram of an input output circuit according to another embodiment of the disclosure.

Referring to FIG. 5, FIG. 5 illustrates a schematic diagram of an input output circuit according to another embodiment of the disclosure. An input output circuit 500 includes an electrostatic discharge protection circuit 510, an input buffer 520, and an output buffer 530. A difference from the embodiment of FIG. 3 is that, in the present embodiment, the control end of the bipolar junction transistor T1 in the electrostatic discharge protection circuit 510 is coupled to the first power rail PL1. During the electrostatic discharge test, a voltage on the first power rail PL1 may be near to the ground voltage VSS. With such a configuration, in the negative voltage test mode for the charged-device model, the bipolar junction transistor T1 may still be turned on in response to the voltage on the pad PAD becoming higher than the ground voltage VSSQ, and a current drain path for electrostatic discharge is generated.

Figure 6:
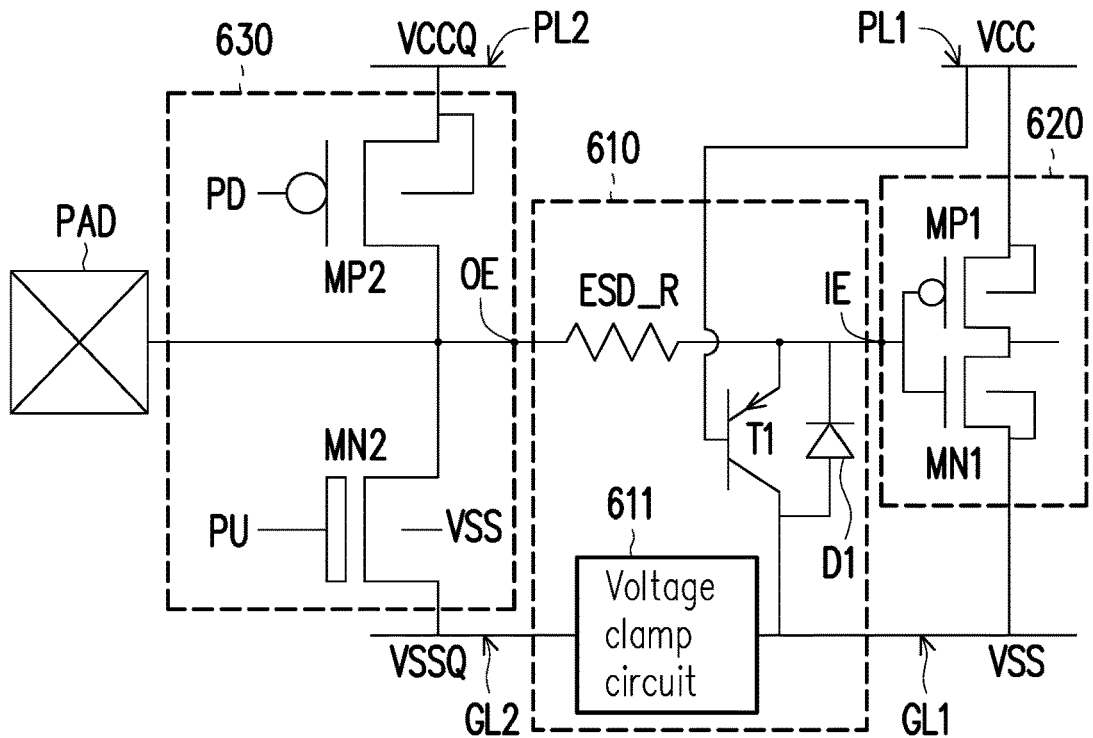
FIG. 6 illustrates a schematic diagram of an input output circuit according to another embodiment of the disclosure.

Referring to FIG. 6, FIG. 6 illustrates a schematic diagram of an input output circuit according to another embodiment of the disclosure. An input output circuit 600 includes an electrostatic discharge protection circuit 610, an input buffer 620, and an output buffer 630. A difference from the embodiment of FIG. 5 is that, in the electrostatic discharge protection circuit 610 in the present embodiment, the diode D1 may be provided at both ends of the bipolar junction transistor T1. The anode of the diode D1 is connected to the first ground rail GL1, and the cathode of the diode D1 is connected to the input end IE of the input buffer 620. The diode D1 may be used to enhance the reverse current drain ability and improve the electrostatic discharge protection ability in the positive voltage test mode during the electrostatic discharge test for the charged-device model.

Figure 7A:
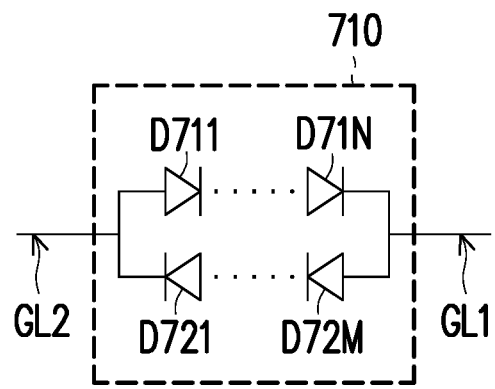
FIG. 7A and FIG. 7B respectively illustrate schematic diagrams of implementations of a voltage clamp circuit in an electrostatic discharge protection circuit according to an embodiment of the disclosure.
Figure 7B:
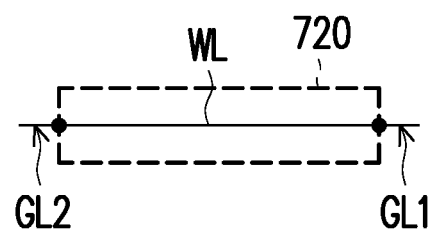

Referring to FIG. 7A and FIG. 7B, FIG. 7A and FIG. 7B respectively illustrate schematic diagrams of implementations of a voltage clamp circuit in an electrostatic discharge protection circuit according to an embodiment of the disclosure. In FIG. 7A, a voltage clamp circuit 710 includes a plurality of diodes D711 to D71N and D721 to D72M. Among them, the diodes D711 to D71N are connected in series according to the same polarity direction and are connected between the first ground rail GL1 and the second ground rail GL2. An anode of the diode D711 may be directly connected to the second ground rail GL2, and a cathode of the diode D71N may be directly connected to the first ground rail GL1. In addition, the diodes D721 to D72M are connected in series according to the same polarity direction and are connected between the first ground rail GL1 and the second ground rail GL2. An anode of the diode D721 may be directly connected to the first ground rail GL1, and a cathode of the diode D72M may be directly connected to the second ground rail GL2.

In the present implementation, the number of the diodes D711 to D71N may be the same as or different from the number of the diodes D721 to D72M. In other implementations, the number of the diodes D711 to D71N may be one, the number of the diodes D721 to D72M may also be one, and there is no other limitation.

In FIG. 7B, a voltage clamp circuit 720 includes a transmission wire WL. The transmission wire WL may provide an impedance, and a voltage clamping effect is achieved using the provided impedance.

In summary, in the disclosure, by providing a bipolar junction transistor in an electrostatic discharge protection circuit, and turning on the bipolar junction transistor during an electrostatic discharge test to provide a drain path for an electrostatic discharge current, the electrostatic discharge protection effect is achieved. In addition, when the bipolar junction transistor of the disclosure is turned on, a voltage difference between the collector and the emitter of the bipolar junction transistor can be clamped through a p-n junction between the base and the emitter of the bipolar junction transistor, such that the bipolar junction transistor is effectively protected from excessive voltage stress and is at less risk of being damaged.

What is claimed is:

1. An electrostatic discharge protection circuit, comprising:
a bipolar junction transistor, having: a first end coupled to an input end of an input buffer and an output end of an output buffer, a second end coupled to a first ground rail, and a control end coupled to one of a first power rail, a second power rail, the first ground rail and a second ground rail,
wherein the input buffer receives a first operating power and a first ground voltage respectively through the first power rail and the first ground rail, and the output buffer receives a second operating power and a second ground voltage respectively through the second power rail and the second ground rail;
wherein a forward-biased diode is formed between the second end and the first end of the bipolar junction transistor to provide a reverse current drain path.

2. The electrostatic discharge protection circuit according to claim 1, further comprising:
a resistor, coupled between a pad and the input end of the input buffer,
wherein the pad is coupled to the output end of the output buffer.

3. The electrostatic discharge protection circuit according to claim 1, wherein the bipolar junction transistor is a PNP transistor, and the control end of the bipolar junction transistor is coupled to the first power rail or the second power rail.

4. The electrostatic discharge protection circuit according to claim 1, wherein the bipolar junction transistor is an NPN transistor, and the control end of the bipolar junction transistor is coupled to the first ground rail or the second ground rail.

5. The electrostatic discharge protection circuit according to claim 1, further comprising:
a voltage clamp circuit, coupled between the first ground rail and the second ground rail.

6. The electrostatic discharge protection circuit according to claim 5, wherein the voltage clamp circuit comprises at least one first diode and at least one second diode, an anode of the at least one first diode is coupled to the first ground rail, a cathode of the at least one first diode is coupled to the second ground rail, an anode of the at least one second diode is coupled to the second ground rail, and a cathode of the at least one second diode is coupled to the first ground rail.

7. The electrostatic discharge protection circuit according to claim 1, wherein the voltage clamp circuit is a transmission wire.

8. An input output circuit, comprising:
- an input buffer, receiving a first operating power and a first ground voltage respectively through a first power rail and a first ground rail;
- an output buffer, receiving a second operating power and a second ground voltage respectively through a second power rail and a second ground rail; and
- an electrostatic discharge protection circuit, comprising:
  - a bipolar junction transistor, having: a first end coupled to an input end of the input buffer and an output end of the output buffer, a second end coupled to the first ground rail, and a control end coupled to one of the first power rail, the second power rail, the first ground rail and the second ground rail,
  - wherein a forward-biased diode is formed between the second end and the first end of the bipolar junction transistor to provide a reverse current drain path.

9. The input output circuit according to claim 8, wherein the electrostatic discharge protection circuit further comprises a resistor, wherein the resistor is coupled between a pad and the input end of the input buffer, and the pad is coupled to the output end of the output buffer.

10. The input output circuit according to claim 8, wherein the bipolar junction transistor is a PNP transistor, and the control end of the bipolar junction transistor is coupled to the first power rail or the second power rail.

11. The input output circuit according to claim 8, wherein the bipolar junction transistor is an NPN transistor, and the control end of the bipolar junction transistor is coupled to the first ground rail or the second ground rail.

12. The input output circuit according to claim 8, wherein the electrostatic discharge protection circuit further comprises a voltage clamp circuit, wherein the voltage clamp circuit is coupled between the first ground rail and the second ground rail.

13. The input output circuit according to claim 12, wherein the voltage clamp circuit comprises at least one first diode and at least one second diode, an anode of the at least one first diode is coupled to the first ground rail, a cathode of the at least one first diode is coupled to the second ground rail, an anode of the at least one second diode is coupled to the second ground rail, and a cathode of the at least one second diode is coupled to the first ground rail.

14. The input output circuit according to claim 12, wherein the voltage clamp circuit is a transmission wire.

15. The input output circuit according to claim 8, wherein the input buffer comprises:
- a first transistor, having: a first end coupled to the first power rail, and a control end that forms the input end of the input buffer; and
- a second transistor, having: a first end coupled to a second end of the first transistor, a second end coupled to the first ground rail, and a control end coupled to the control end of the first transistor.

16. The input output circuit according to claim 15, wherein the output buffer comprises:
- a third transistor, having: a first end coupled to the second power rail, a control end that receives a first control signal, and a second end that forms the output end of the output buffer; and
- a fourth transistor, having: a first end coupled to the second end of the third transistor, a second end coupled to the second ground rail, and a control end coupled to a second control signal.

17. The input output circuit according to claim 16, wherein the first transistor, the second transistor, the third transistor and the fourth transistor are metal oxide semiconductor field-effect transistors.

18. The input output circuit according to claim 17, wherein a bulk of the fourth transistor is coupled to the first ground rail.

* * * * *